United States Patent
Li et al.

(10) Patent No.: US 10,396,157 B1
(45) Date of Patent: Aug. 27, 2019

(54) SEMICONDUCTOR DEVICE

(71) Applicant: United Microelectronics Corp., Hsinchu (TW)

(72) Inventors: Shin-Hung Li, Nantou County (TW); Kuan-Chuan Chen, Taichung (TW); Nien-Chung Li, Hsinchu (TW); Wen-Fang Lee, Hsinchu (TW); Chih-Chung Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/913,533

(22) Filed: Mar. 6, 2018

(30) Foreign Application Priority Data

Feb. 5, 2018 (CN) .......................... 2018 1 0112699

(51) Int. Cl.
| | |
|---|---|
| *H01L 27/06* | (2006.01) |
| *H01L 29/08* | (2006.01) |
| *H01L 29/66* | (2006.01) |
| *H01L 29/06* | (2006.01) |
| *H01L 21/762* | (2006.01) |

(52) U.S. Cl.
CPC .... *H01L 29/0847* (2013.01); *H01L 21/76224* (2013.01); *H01L 27/0617* (2013.01); *H01L 29/0649* (2013.01); *H01L 29/66545* (2013.01)

(58) Field of Classification Search
CPC .................................................... H01L 27/0617
USPC ........................................................ 257/506
See application file for complete search history.

(56) References Cited

U.S. PATENT DOCUMENTS

| | | | |
|---|---|---|---|
| 5,686,334 A | * | 11/1997 | Sundaresan ............. H01L 27/11 257/E21.661 |
| 8,477,006 B2 | | 7/2013 | Yang et al. |
| 2017/0125297 A1 | | 5/2017 | Wang et al. |

* cited by examiner

*Primary Examiner* — Hsin Yi Hsieh
(74) *Attorney, Agent, or Firm* — J.C. Patents

(57) ABSTRACT

A semiconductor device includes semiconductor layer having first device region and second device region. A shallow trench isolation (STI) structure is in the semiconductor layer and located at periphery of the first and second device regions. A first and second insulating layers are on the semiconductor layer and respectively located in the first and second device regions. A first gate structure is located on the first insulating layer. A source region and a drain region are in the semiconductor layer and are located at two sides of the first gate structure. A gate doped region is in a surface region of the semiconductor layer in the second device region to serve as a second gate structure. A channel layer is located on the second insulating layer. A source layer and a drain layer are on the STI structure and are located at two sides of the channel layer.

11 Claims, 4 Drawing Sheets

SEMICONDUCTOR DEVICE

CROSS-REFERENCE TO RELATED APPLICATION

This application claims the priority benefit of China application serial no. 201810112699.9, filed on Feb. 5, 2018. The entirety of the above-mentioned patent application is hereby incorporated by reference herein and made a part of this specification.

BACKGROUND OF THE INVENTION

Field of the Invention

The disclosure relates to a semiconductor device technique, and in particular, to a fabrication technique of a transistor semiconductor device.

Description of Related Art

Digital electronic devices, e.g., displays, TVs, and cameras, all include integrated circuits for executing designed functions. The integrated circuit generally includes a large number of transistors to complete the designed circuit.

To accommodate the demands for more powerful functions and a smaller size of the electronic device, various transistor structures have been proposed. Specifically, in addition to a transistor structure based on a silicon substrate, other structures, including a thin-film transistor and a fin transistor, are also proposed.

In other words, in consideration of fabrication and size, designs of semiconductor transistors are constantly developed to accommodate fabrication of electronic devices having different functions.

SUMMARY OF THE INVENTION

An embodiment of the invention provides a semiconductor device including a semiconductor layer having a first device region and a second device region. A shallow trench isolation structure is in the semiconductor layer and is located at a periphery of the first device region and the second device region. A first insulating layer and a second insulating layer are on the semiconductor layer and are respectively located in the first device region and the second device region. A first gate structure is located on the first insulating layer. A source region and a drain region are in the semiconductor layer and are located at two sides of the first gate structure. A gate doped region is in a surface region of the semiconductor layer in the second device region to serve as a second gate structure. A channel layer is located on the second insulating layer. A source layer and a drain layer are on the shallow trench isolation structure and are located at two sides of the channel layer.

The semiconductor device according to an embodiment further includes an isolation doped region in the semiconductor layer located below the gate doped region to isolate the gate doped region, wherein the gate doped region includes a first conductivity type dopant, and the isolation doped region includes a second conductivity type dopant different from the first conductivity type dopant.

In the semiconductor device according to an embodiment, the first gate structure, the source layer, and the drain layer are formed by a dummy gate replacement technique.

In the semiconductor device according to an embodiment, the dummy gate replacement technique includes steps below. A dummy material layer is formed on the first insulating layer and the second insulating layer. The dummy material layer is defined to form a first portion on the first insulating layer and a second portion on the second insulating layer. An inner dielectric layer is formed to cover the first portion and the second portion of the dummy material layer. The inner dielectric layer is polished to expose the dummy material layer. The first portion of the dummy material layer is removed to obtain a first opening, and a second opening is obtained at two peripheral regions of the second portion, wherein the remaining second portion serves as the channel layer. The first gate structure is formed in the first opening, and the source layer and the drain layer are formed in the second opening.

In the semiconductor device according to an embodiment, a material of the dummy material layer includes polycrystalline silicon, amorphous silicon, GaN, indium gallium zinc oxide, ZnO, or an oxide semiconductor material.

In the semiconductor device according to an embodiment, the first gate structure, the source layer, and the drain layer are formed of a same material including Al, W, TiN, or TaN.

In the semiconductor device according to an embodiment, the semiconductor layer is a top portion of a silicon substrate or a silicon epitaxial layer on a substrate.

In the semiconductor device according to an embodiment, a portion of the gate doped region located in the second device region extends out of the channel layer in a horizontal direction.

In the semiconductor device according to an embodiment, the channel layer located in the second device region is at a same height as the first gate structure located in the first device region.

The semiconductor device according to an embodiment further includes a first spacer located at a sidewall of the first gate structure and a second spacer located at an outer sidewall of the source layer and the drain layer.

In the semiconductor device according to an embodiment, a material of the channel layer includes polycrystalline silicon, amorphous silicon, GaN, indium gallium zinc oxide, ZnO, or an oxide semiconductor material.

An embodiment of the invention provides a method for fabricating a semiconductor device including steps below. A semiconductor layer having a first device region and a second device region is provided. A shallow trench isolation structure is formed in the semiconductor layer and is located at a periphery of the first device region and the second device region. A gate doped region is formed in a surface region of the semiconductor layer in the second device region to serve as a second gate structure. The gate doped region includes a first conductivity type dopant. A first insulating layer and a second insulating layer are formed on the semiconductor layer and are respectively located in the first device region and the second device region. A dummy material layer is formed on the first insulating layer and the second insulating layer. A dummy gate replacement technique is performed to form a first gate structure in the first device region and a source/drain layer in the second device region. The source/drain layer is formed on a portion at two sides of the dummy material layer on the second insulating layer. A remaining portion of the dummy material layer serves as a channel layer. The gate doped region in the semiconductor layer serves as the second gate structure.

The method for fabricating a semiconductor device according to an embodiment further includes forming an isolation doped region in the semiconductor layer located below the gate doped region to isolate the gate doped region, wherein the gate doped region includes a first conductivity type dopant, and the isolation doped region includes a second conductivity type dopant different from the first conductivity type dopant.

In the method for fabricating a semiconductor device according to an embodiment, the dummy gate replacement technique includes steps below. The dummy material layer is defined to form a first portion on the first insulating layer and a second portion on the second insulating layer. An inner dielectric layer is formed to cover the first portion and the second portion of the dummy material layer. The inner dielectric layer is polished to expose the dummy material layer. The first portion of the dummy material layer is removed to obtain a first opening, and a second opening is obtained at two peripheral regions of the second portion, wherein the remaining second portion serves as the channel layer. The first gate structure is formed in the first opening, and the source layer and the drain layer are formed in the second opening.

In the method for fabricating a semiconductor device according to an embodiment, the first gate structure, the source layer, and the drain layer are formed of a same material including Al, W, TiN, or TaN.

In the method for fabricating a semiconductor device according to an embodiment, the semiconductor layer is a top portion of a silicon substrate or a silicon epitaxial layer on a substrate.

In the method for fabricating a semiconductor device according to an embodiment, a portion of the gate doped region located in the second device region extends out of the channel layer in a horizontal direction.

In the method for fabricating a semiconductor device according to an embodiment, the channel layer located in the second device region is at a same height as the first gate structure located in the first device region.

The method for fabricating a semiconductor device according to an embodiment further includes forming a first spacer at a sidewall of the first gate structure and forming a second spacer at an outer sidewall of the source layer and the drain layer.

In the method for fabricating a semiconductor device according to an embodiment, a material of the channel layer includes polycrystalline silicon, amorphous silicon, GaN, indium gallium zinc oxide, ZnO, or an oxide semiconductor material.

BRIEF DESCRIPTION OF THE DRAWINGS

The accompanying drawings are included to allow further understanding of the embodiments of invention, and the drawings are incorporated into the specification and form a part of the specification. The drawings illustrate the embodiments of the invention and the drawings and the description together are used to interpret the principles of the invention.

DESCRIPTION OF THE EMBODIMENTS

Figure 1:
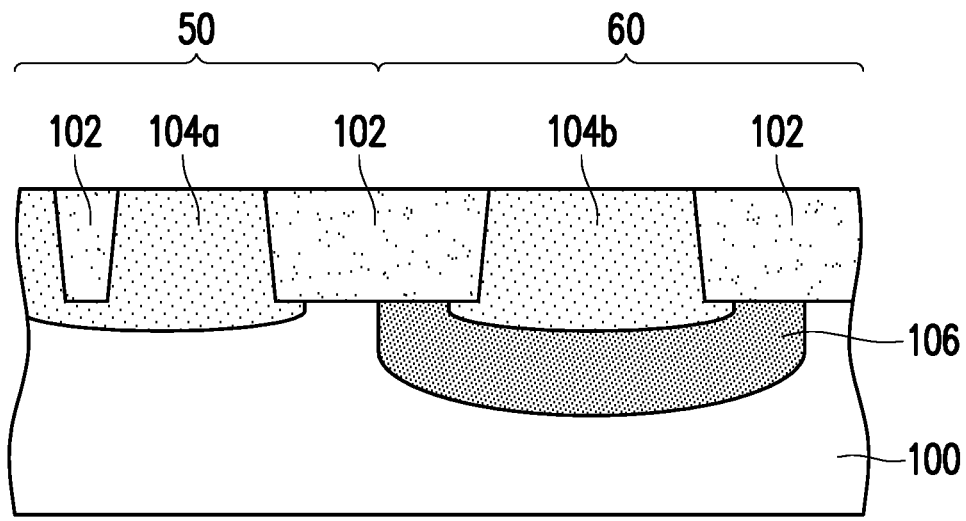
FIG. 1 to FIG. 7 are semiconductor cross-sectional schematic diagrams illustrating a process of a method for fabricating a semiconductor device according to an embodiment of the invention.

Reference will now be made in detail to the exemplary embodiments of the invention, examples of which are illustrated in the accompanying drawings. Wherever possible, the same reference numbers are used in the drawings and the description to refer to the same or like parts.

In the embodiments of the invention, when a transistor based on a substrate is fabricated, a thin-film transistor may also be fabricated at the same time, and a gate structure of the thin-film transistor is provided by the substrate. The substrate is, for example, a silicon substrate or a semiconductor epitaxial layer. A doped region formed by doping the substrate at an appropriate doping concentration is used as the gate structure. A gate structure of this type is also referred to as a substrate gate to indicate that the gate structure is formed from a doped region of the substrate.

Some embodiments will be provided below for describing the invention, but the invention is not limited to the embodiments provided.

FIG. 1 to FIG. 7 are semiconductor cross-sectional schematic diagrams illustrating a process of a method for fabricating a semiconductor device according to an embodiment of the invention.

Referring to FIG. 1, a substrate 100 is provided as a basis for fabrication. The substrate 100 is, for example, a silicon substrate or a semiconductor epitaxial layer. The substrate 100 has, for example, a first device region 50 and a second device region 60. The first device region 50 is configured to fabricate a general transistor, and the second device region 60 is configured to fabricate a substrate-gate transistor provided in the embodiments of the invention in a compatible fabrication process.

A shallow trench isolation structure 102 is formed in the substrate 100 and is located at a periphery of the first device region 50 and the second device region 60 to isolate the transistor to be fabricated. In the substrate 100, a doped region 104a and a gate doped region 104b are first formed respectively corresponding to the first device region 50 and the second device region 60. The doped region 104a corresponding to the first device region 50 is a substrate doped region corresponding to a transistor conductivity type, and will be subsequently formed with a source/drain region required by the transistor. The gate doped region 104b corresponding to the second device region 60 will be used as the gate structure of the transistor after fabrication is subsequently completely. Moreover, since the gate doped region 104b serves as the gate structure of the transistor, in consideration of isolation, an isolation doped region 106 may be further formed below it. The gate doped region 104b and the isolation doped region 106 are doping of different conductivity types.

Figure 2:
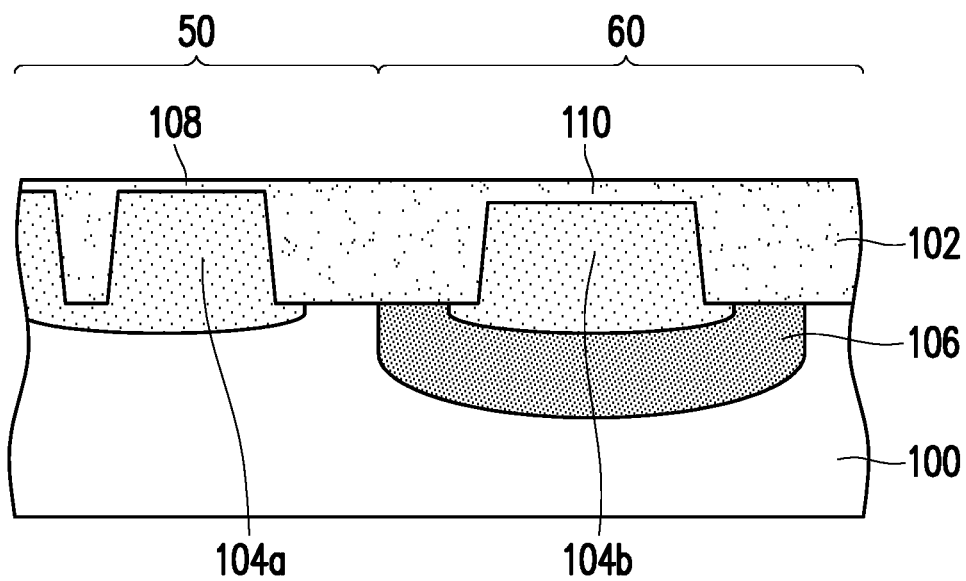

Referring to FIG. 2, insulating layers 108, 110 are respectively formed in the first device region 50 and the second device region 60 and respectively function as gate insulating layers. Since the first device region 50 is configured to fabricate a general transistor and its operation voltage falls in a low voltage operation range, the insulating layer 108 does not require a large thickness. The transistor of the second device region 60 is, for example, a high-voltage transistor operated at a high voltage, and its insulating layer 110 has to be sufficiently large. However, the transistor of the second device region 60 may also be a general low-voltage transistor and is not limited to the high-voltage transistor. Therefore, the insulating layer 108 and the insulating layer 110 may be identical or different, which may be determined according to the actual design.

Figure 3:
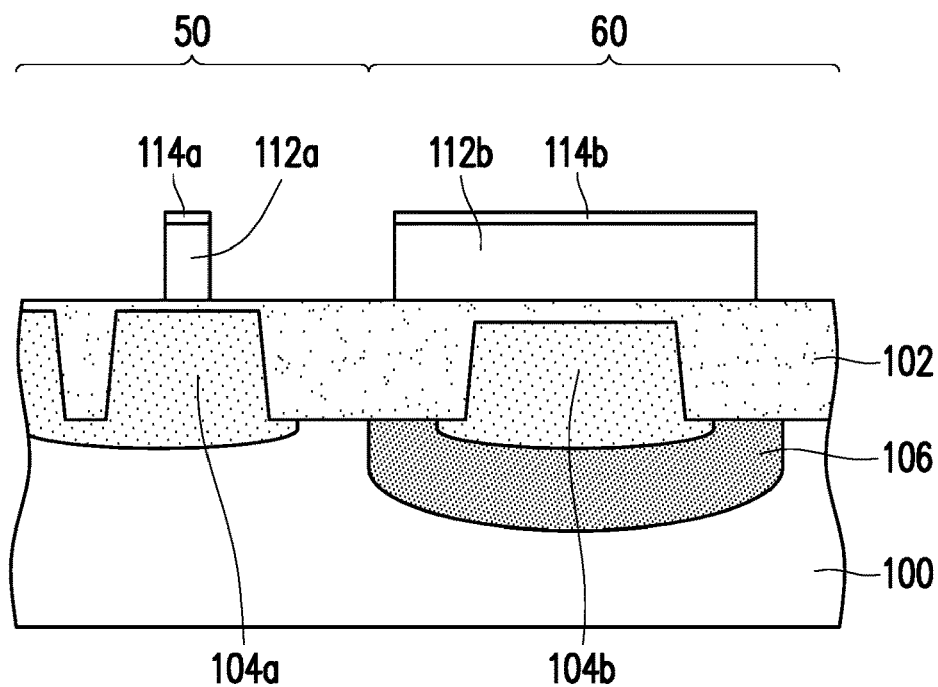

Referring to FIG. 3, dummy material layers are first formed on the insulating layers 108, 110 and the shallow trench isolation structure 102. Through photolithography definition techniques, dummy material layers 112a, 112b are respectively formed on the first device region 50 and the second device region 60. According to actual fabrication requirements, mask layers such as capping layers 114a, 114b may be provided on surfaces of the dummy material layers 112a, 112b.

Here, the dummy material layer 112a is a dummy gate that will be removed in a subsequent fabrication process and replaced by a real gate material. However, in subsequent fabrication, the dummy material layer 112b corresponds to the gate doped region 104b and will function as a channel layer of the transistor. With the function of the channel layer, a material of the dummy material layer 112a is, for example, polycrystalline silicon, amorphous silicon, GaN, indium gallium zinc oxide (IGZO), ZnO, or an oxide semiconductor material.

Figure 4:
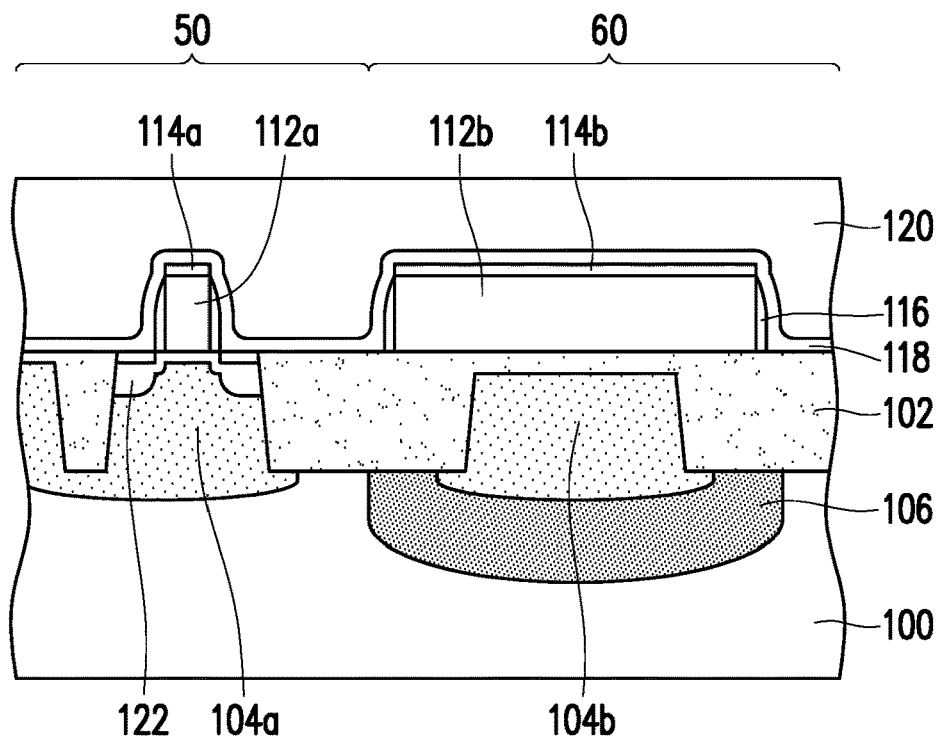

Referring to FIG. 4, as a general transistor is formed according to the first device region 50, a spacer 116 is formed at two sidewalls of the dummy material layer 112a and a capping layer 114a is formed on an upper surface. Meanwhile, the spacer 116 is also formed at two sidewalls of the dummy material layer 112b and a capping layer 114b is formed on an upper surface. Moreover, a conformal hard dielectric layer 118 may also be formed all over. Afterwards, a dielectric layer 120 is formed, covering the dummy material layers 112a, 112b.

Here, the dummy material layer 112a is a dummy gate. A corresponding source/drain region 122 may be formed at two sides of the dummy material layer 112a in the substrate 100 in advance.

Figure 5:
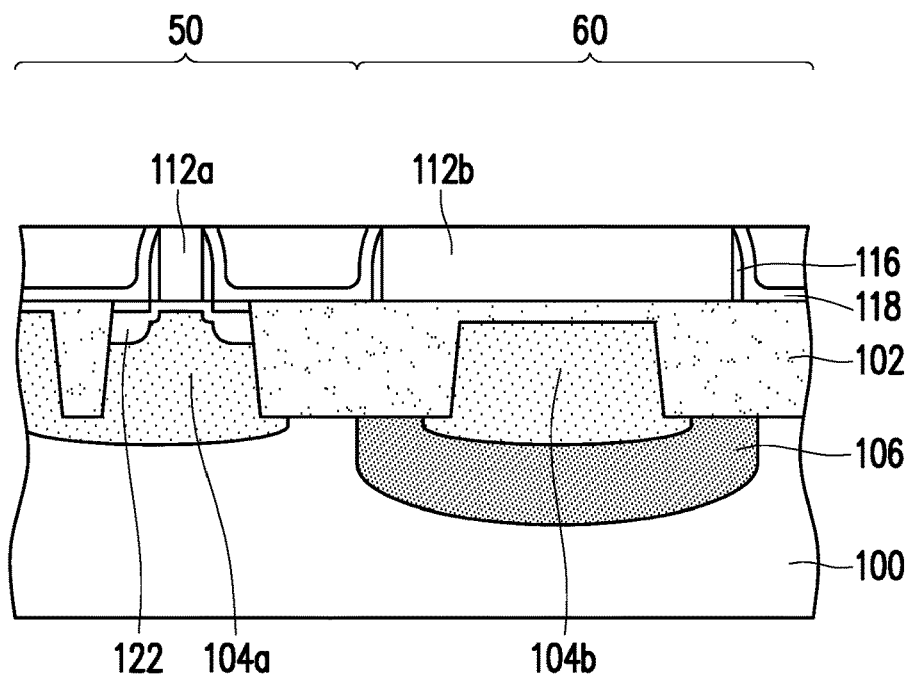

Referring to FIG. 5, a polishing technique is performed on the inner dielectric layer 120 until the dummy material layers 112a, 112b are exposed. Here, the capping layer 114a and a portion of the hard dielectric layer 118 are also removed. In general, the capping layer 114a, the spacer 116, the hard dielectric layer 118, and the dielectric layer 120 may be generally referred to as the inner dielectric layer and are not specifically limited here.

Figure 6:
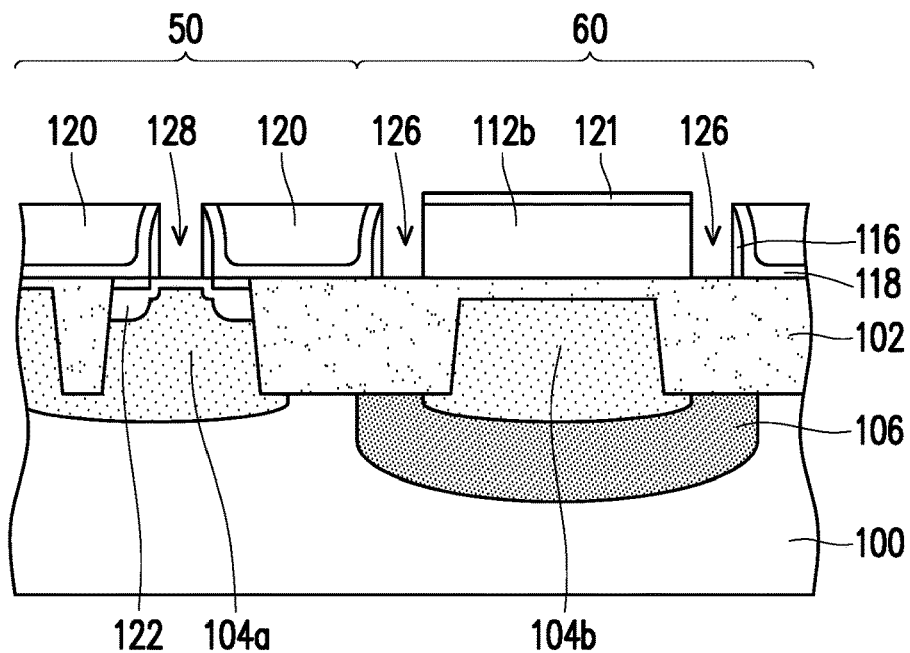

Referring to FIG. 6, an etch mask layer 121 is formed on the exposed dummy material layer 112b and only covers a middle region. Therefore, a peripheral region of the dummy material layer 112b remains exposed. The peripheral region reserves a position for subsequently forming a source/drain layer. The etch mask layer 121 is used to perform an etching back technique, for example, to remove the exposed portion of the dummy material layer 112b and the dummy material layer 112a and obtain an opening 128 and an opening 126.

Figure 7:
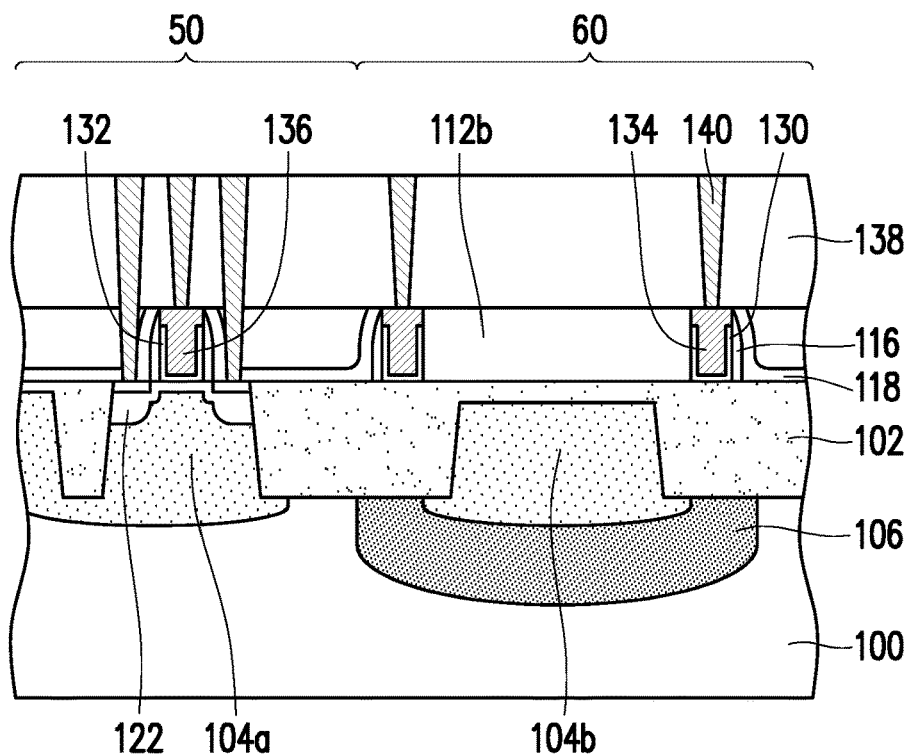

Referring to FIG. 7, a gate structure 136 is formed in the opening 128. Moreover, according to the actual requirement, the gate structure 136 further includes, for example, a barrier layer 132, but the gate structure 136 of the embodiments of the invention is not limited to a specific structure. The opening 126 is configured for forming the source/drain layer 134 at the two sides of the dummy material layer 112b. As mentioned above, the dummy material layer 112b provides a structure of the channel layer for the substrate-gate transistor in the second device region 60.

In consideration of reducing the fabrication costs, the source/drain layer 134 in the opening 126 may be completed along with the gate structure 136 in the opening 128 in the same step. Similarly, the source/drain layer 134 may also include a barrier layer 130. Accordingly, it is not necessary to form the source/drain layer 134 in an additional fabrication step. However, the invention is not limited to the embodiments provided here.

In the case where the gate structure 136 and the source/drain layer 134 are simultaneously formed, their materials are identical and may include Al, W, TiN, or TaN, for example.

Here, the foregoing fabrication process of FIG. 3 to FIG. 5 may be collectively referred to as a dummy gate replacement technique. In case of the transistor of the first device region 50, the dummy gate is formed, is later removed, and then is replaced by the real gate structure 136. In this process, the source/drain layer 134 is simultaneously formed in the transistor of the second device region 60.

After the transistors of the first device region 50 and the second device region 60 are completed, various contact plugs 140 may be fabricated, for example, by using the inner dielectric layer 138 in a subsequent fabrication process. The embodiments of the invention do not specifically limit the subsequent fabrication process.

Figure 8:
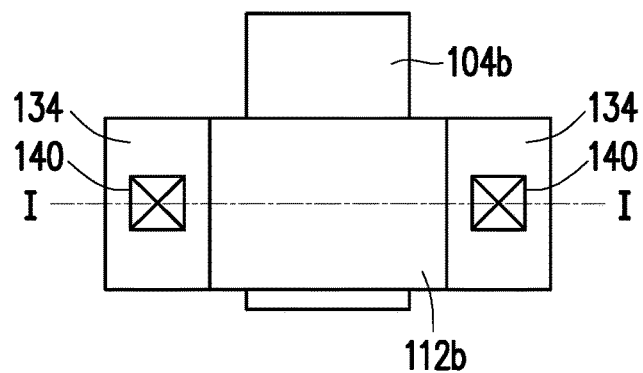
FIG. 8 is a top schematic diagram illustrating a transistor structure using a substrate as a gate according to an embodiment of the invention.

FIG. 8 is a top schematic diagram illustrating a transistor structure using a substrate as a gate according to an embodiment of the invention. In the transistor of the second device region 60, the gate doped region 104b serves as the gate structure requiring application of an operation voltage. Therefore, in the top-view layout structure, the gate doped region 104b extends out of the dummy material layer 112b that serves as the channel layer. A cross-sectional structure corresponding to a cutting line I-I in FIG. 8 is the structure of the second device region 60 in FIG. 7. The gate doped region 104b is provided by the semiconductor layer of the substrate 100 and is located at a lower position. The channel layer of the dummy material layer 112b and the source/drain layer 134 are located at an upper position.

In the substrate-gate transistor provided in the embodiments of the invention, the fabrication process is also compatible with the fabrication of other transistors and does not substantially increase difficulty in fabrication. In this sense, the embodiments of the invention provide another option for a transistor structure. The substrate-gate transistor of the embodiments of the invention may also be used to fabricate a high-voltage transistor.

Lastly, it shall be noted that the foregoing embodiments are meant to illustrate, rather than limit, the technical solutions of the embodiments of the invention. Although the invention has been detailed with reference to the foregoing embodiments, persons ordinarily skilled in the art shall be aware that they may still make modifications to the technical solutions recited in the foregoing embodiments or make equivalent replacements of part or all of the technical features therein, and these modifications or replacements do not cause the nature of the corresponding technical solutions to depart from the scope of the technical solutions of the embodiments of the invention.

What is claimed is:

1. A semiconductor device comprising:
   a semiconductor layer having a first device region and a second device region;
   a shallow trench isolation structure, in the semiconductor layer, located at a periphery of the first device region and the second device region;
   a first insulating layer and a second insulating layer, on the semiconductor layer, respectively located in the first device region and the second device region;
   a first gate structure located on the first insulating layer;
   a source region and a drain region, in the semiconductor layer, located at two sides of the first gate structure;
   a gate doped region in a surface region of the semiconductor layer in the second device region to serve as a second gate structure;
   a channel layer located on the second insulating layer; and
   a source layer and a drain layer, directly on the shallow trench isolation structure, located at two sides of the channel layer.

2. The semiconductor device according to claim 1, further comprising an isolation doped region, in the semiconductor layer, located below the gate doped region to isolate the gate doped region, wherein the gate doped region comprises a first conductivity type dopant, and the isolation doped region comprises a second conductivity type dopant different from the first conductivity type dopant.

3. The semiconductor device according to claim 1, wherein the first gate structure, the source layer, and the drain layer are formed by a dummy gate replacement technique.

4. The semiconductor device according to claim 3, wherein the dummy gate replacement technique comprises:
   forming a dummy material layer on the first insulating layer and the second insulating layer;
   defining the dummy material layer to form a first portion on the first insulating layer and a second portion on the second insulating layer;
   forming an inner dielectric layer covering the first portion and the second portion of the dummy material layer;
   polishing the inner dielectric layer to expose the dummy material layer;
   removing the first portion of the dummy material layer to obtain a first opening and obtaining a second opening at two peripheral regions of the second portion, wherein the remaining second portion serves as the channel layer; and
   forming the first gate structure in the first opening and forming the source layer and the drain layer in the second opening.

5. The semiconductor device according to claim 4, wherein a material of the dummy material layer comprises polycrystalline silicon, amorphous silicon, GaN, indium gallium zinc oxide, or ZnO.

6. The semiconductor device according to claim 1, wherein the first gate structure, the source layer, and the drain layer are formed of a same material comprising Al, W, TiN, or TaN.

7. The semiconductor device according to claim 1, wherein the semiconductor layer is a top portion of a silicon substrate or a silicon epitaxial layer on a substrate.

8. The semiconductor device according to claim 1, wherein a portion of the gate doped region located in the second device region extends out of the channel layer in a horizontal direction.

9. The semiconductor device according to claim 1, wherein the channel layer located in the second device region is at a same height as the first gate structure located in the first device region.

10. The semiconductor device according to claim 1 further comprising:
    a first spacer located at a sidewall of the first gate structure; and
    a second spacer located at an outer sidewall of the source layer and the drain layer.

11. The semiconductor device according to claim 1, wherein a material of the channel layer comprises polycrystalline silicon, amorphous silicon, GaN, indium gallium zinc oxide, or ZnO.

* * * * *